(12) United States Patent
Gaugler et al.

(10) Patent No.: US 8,302,056 B2
(45) Date of Patent: Oct. 30, 2012

(54) METHOD AND SYSTEM FOR PLACEMENT OF ELECTRONIC CIRCUIT COMPONENTS IN INTEGRATED CIRCUIT DESIGN

(75) Inventors: Elmar Gaugler, Boeblingen (DE); Wilhelm Haller, Boeblingen (DE); Friedhelm Kessler, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 53 days.

(21) Appl. No.: 12/831,306

(22) Filed: Jul. 7, 2010

(65) Prior Publication Data

US 2011/0035712 A1 Feb. 10, 2011

(30) Foreign Application Priority Data

Aug. 7, 2009 (DE) ...................................... 9167449

(51) Int. Cl.
*G06F 17/50* (2006.01)
(52) U.S. Cl. ......... 716/119; 176/118; 176/124; 176/125
(58) Field of Classification Search .................. 716/118, 716/119, 124, 125
See application file for complete search history.

(56) References Cited

U.S. PATENT DOCUMENTS

| | | | |
|---|---|---|---|
| 7,093,208 B2 | 8/2006 | Cho et al. | |
| 2004/0078767 A1* | 4/2004 | Burks et al. | 716/8 |
| 2005/0183054 A1* | 8/2005 | Wein et al. | 716/11 |
| 2006/0190899 A1* | 8/2006 | Migatz et al. | 716/13 |
| 2007/0204252 A1* | 8/2007 | Furnish et al. | 716/10 |
| 2008/0216038 A1* | 9/2008 | Bose | 716/8 |
| 2008/0301607 A1* | 12/2008 | Jatkowski et al. | 716/7 |
| 2009/0119622 A1* | 5/2009 | Cortadella et al. | 716/3 |
| 2009/0217227 A1* | 8/2009 | Dotson et al. | 716/7 |
| 2009/0254874 A1* | 10/2009 | Bose | 716/6 |
| 2011/0289468 A1* | 11/2011 | Keinert et al. | 716/124 |

OTHER PUBLICATIONS

Design Planning Methodology for Rapid Chip Deployment, David E. Lackey, IBM Microelectronics, Essex Junction, Vermont 05452, Year 2001.

* cited by examiner

*Primary Examiner* — Suresh Memula
(74) *Attorney, Agent, or Firm* — Richard M. Kotulak

(57) ABSTRACT

The invention relates to a method and a system for placing macros of a multilevel hierarchical description of a design unit on a chip. The method starts off by repartitioning the macro structure of the design unit into a set of latch macros and a set of combinatorial macros. By definition, a combinatorial macro is constructed in such a way that it contains no latches, and a latch macro contains latches and is constructed in such a way that each primary input/output of the latch macro coincides with an input or an output of a latch within said latch macro. After repartitioning the macro structure, the latch macros are synthesized within temporary boundaries and placed on the chip. Subsequently, the combinatorial macros are sequentially placed within a temporary boundary and synthesized one by one.

11 Claims, 8 Drawing Sheets

METHOD AND SYSTEM FOR PLACEMENT OF ELECTRONIC CIRCUIT COMPONENTS IN INTEGRATED CIRCUIT DESIGN

FIELD OF THE INVENTION

The invention relates generally to the design of high-performance digital integrated circuits. Specifically, the invention provides a method and a system for placing and synthesizing electronic circuits.

BACKGROUND OF THE INVENTION

In the process of integrated circuit development, the design of the electronic circuit to be developed is generally laid out by a logic designer. The logic designer defines the specific implementation of a desired function, partitions this function into logically coherent chunks, so-called macros, and defines primary input and output pins of these macros. In this context, the term "macro" is used to denote a design of a logic function on a chip and specifies the interconnection of the required logic elements as well as the physical pathways and wiring patterns between the components of the macro. In order to reflect the hierarchical structure of a design unit in terms of macros, the design is typically described in terms of a hierarchical netlist or in terms of a hardware description language such as hierarchical VHDL. Specifically, the macros proper may be described in macro VHDL, whereas the connectivity of the macros within the unit may be described in unit VHDL.

Once the logic designer has desired function in terms of a hierarchical description, for example in a hardware description language such as VHDL or Verilog, an automatic tool such as a Random Logic Macro generator RLM may generate (synthesize) a physical electronic layout corresponding to the logic structure of electronic design unit. If automatic synthesis does not yield a satisfactory result, it may be supplemented or replaced by manual placement and routing by a custom designer.

Subsequently, the macros thus synthesized are placed on the chip and have to be wired in such a way as to meet predetermined requirements related to timing, signal accuracy etc. This process step of placing and wiring the macros is carried out by a unit integrator, based on a so-called "macro abstracts" which relate to the physical properties of the macros such as size, shape, pin position etc. The unit integrator thus places the macros onto the unit and routes all connections between the macro pins and to/from the unit pins. The unit integrator typically handles macros and macro abstracts as black boxes. In this context, the unit itself can be considered as a large macro, comprising macro abstracts, macro pins and unit pins.

In order to avoid conflicts during integrated circuit design, the usage of resources (e.g. amount of wiring space and wiring levels) within the unit is negotiated between the logic designer and the unit integrator in terms of contracts regulating the amount and specifics of resources to be used by logic design and unit integration. As an example, the synthesis program (or the custom designer) which translates macro VHDL code of a given macro into a physical implementation of that macro, is assigned predefined wiring resources specified by this macro's contract; these resources are then blocked for all other macros. Given that a unit may contain hundreds of macros, negotiating the corresponding contracts while taking into account routing restrictions is a formidable task.

As the design is wired, buffered and verified, macro size and shape, pin position etc. as well as available resources such as wiring levels, blockages etc. are contracted iteratively between unit integrator and logic designer. This negotiation process uses up a lot of time and resources: Whenever the logic designer makes a modification (such as changing the pin number and/or pin position) to a macro, this requires the unit integrator to readjust macro abstracts and wiring on the chip. This is an iterative process in which macro abstracts are passed back and forth and negotiated between the logic designer and the unit integrator. The logic designer may make modifications (such as changing the number of pins and/or pin position) within a specific macro which may in turn require the unit integrator to readjust one or several macro abstracts on the chip. These modification steps are cumbersome and error-prone and lie beyond the key tasks of the unit integrator. Moreover, this process brings about blockages (regions of the chip which are unavailable for placing a given macro) which are based on assumptions and may be wrong or waste resources.

Thus, there is a need of an electronic design automation (EDA) tool which relieves the unit integrator from the task of manually adjusting macro abstracts when a modification in a macro cell has occurred.

SUMMARY OF THE INVENTION

It is an object of the invention to provide a method and a system which makes the process of placing circuits on a chip safer and more comfortable for the unit integrator and which enables a more efficient and economical use of chip space during placement.

These objectives are achieved by the features of the independent claims. The other claims and the specification disclose advantageous embodiments of the invention.

According to a first aspect of the invention, a method for placing macros of a multilevel hierarchical description of a design unit on a chip is provided. The method comprises the steps of (1) repartitioning the macro structure of the design unit into a set of latch macros and a set of combinatorial macros, (2) synthesizing and placing the latch macros and subsequently (3) placing and synthesizing the combinatorial macros. By definition, a latch macro contains latches and is constructed in such a way that each primary input/output of the latch macro coincides with an input or an output of a latch within said latch macro. Combinatorial macros are constructed in such a way that they contain no latches.

According to a second aspect of the invention, a system for placing macros of a multilevel hierarchical description of a design unit on a chip is provided. The system comprises (1) a repartitioning system for repartitioning the macro structure of the design unit into a set of latch macros and a set of combinatorial macros, (2) a latch macro placement system for synthesizing and placing latch macros and (3) a combinatorial macro placement system for placing and synthesizing combinatorial macros.

Advantageously, the latch macros are synthesized and placed by executing the steps of (1) defining temporary boundaries for the latch macros, (2) synthesizing the latch macros within the temporary boundaries and (3) placing the latch macros thus synthesized within the design unit (1). Advantageously, the combinatorial macros are synthesized and placed sequentially one by one, by executing the steps of (1) defining a temporary boundary for the combinatorial macro, (2) generating blockages within said temporary boundary, the blockages corresponding to areas unavailable for placement, and (3) synthesizing the combinatorial macro within said temporary boundary.

BRIEF DESCRIPTION OF THE SEVERAL VIEWS OF THE DRAWINGS

The present invention together with the above-mentioned and other objects and advantages may best be understood from the following detailed description of the embodiments, but not restricted to the embodiments, wherein is shown in.

Figure 1A:
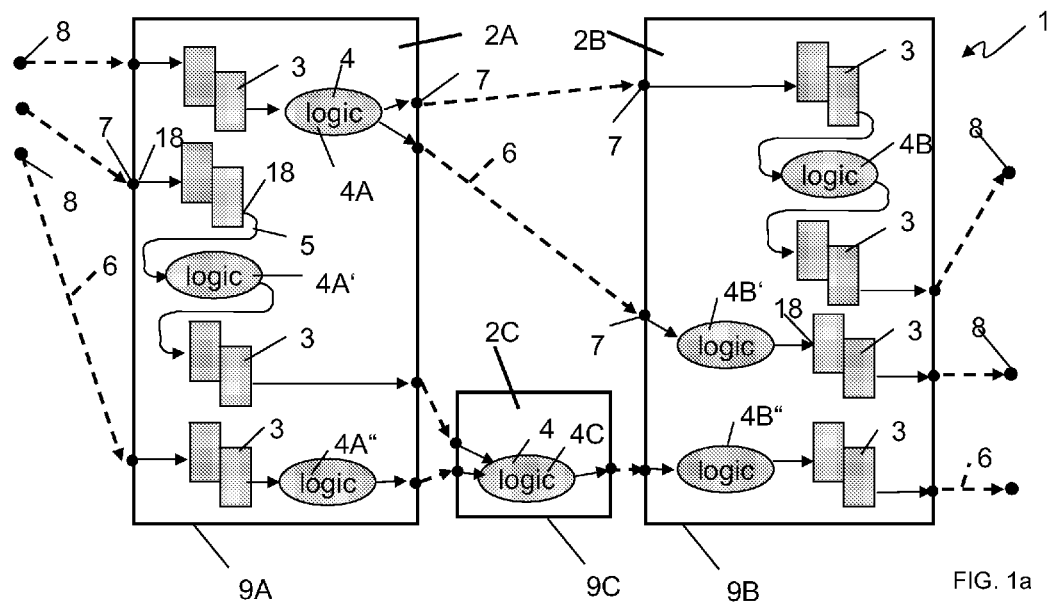
FIG. 1a a schematic representation of an electronic design unit comprising three macros, as seen by a logic designer.

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

DETAILED DESCRIPTION

The invention relates to a method of placing and routing macros within a unit on a chip and makes use of a multilevel hierarchical description, an approach generally used for the physical design of complex integrated circuits. The lowest level of this hierarchy is represented by a library of basic cells (such as latches) and logic gates (such as inverters, nands and nors). The next hierarchical level is a macro (which is composed of library cells), and the subsequent hierarchical level is represented by a unit (e.g. a floating point unit, fix-point unit . . . ). Each unit consists a set of macros and in addition may comprise buffering circuitry in-between the macros within the unit which may be necessary in order to drive long signal wires. The next hierarchical level above the unit is a processor core. A chip can then be composed of multiple cores. While the invention will be explained in terms of a unit (as the top level) and macros (as the instances within the unit), the invention can in fact be applied to any hierarchical design structure, i.e. any design structure with a top level which is split into several substructures (instances). Note also that the invention can be used for a multilevel hierarchical structure. Thus, the subsequent description in terms of a design unit comprising macros is intended to illustrate only a typical embodiment and should not be considered as limiting the scope of the invention.

In the process of designing a custom electronic circuit, the specific implementation of the desired function, the partitioning of this function in terms of macros and the definition of macro input/output pins is generally laid out by a logic designer. This design is typically described in terms of a hierarchical hardware description language such as hierarchical VHDL, so that the macros are described in macro VHDL, whereas the connectivity of the macros within the unit is described in unit VHDL.

Based on this description, a physical implementation of the macro structure is generated by synthesis. Subsequently, the physical macros—i.e. the physical representations of the logic functions, including the interconnection of the required logic elements within the macros as well as the physical pathways and wiring patterns between the components of each macro—need to be placed on the chip and wired in such a way as to meet predetermined requirements related to timing, signal accuracy etc., thus yielding a valid design. This process step of placing and wiring the macros is carried out by a unit integrator. Generally, the physical shape of each macro is assumed to be rectangular, so that the placement problem involves fitting a set of rectangles with predetermined pin numbers/positions on the chip. Note that all circuits and wiring resources of a given macro have to be physically located within the physical dimensions of the macro.

In order to minimize development time, macro designers and unit integrators work in parallel and start their respective tasks at the same point in time. In order to accomplish this, macro designers and unit integrators have to agree beforehand on certain parameters of the unit to be configured, such as size and abstract ratio of the macro cells of the unit. A so-called contract between the macro designer and the unit integrator defines the fraction of wiring resources that each of them can use. Usually, this contract is orthogonal in the sense that resources assigned to the macro designer are not accessible to the unit integrator and vice versa. Thus, the contract contains blockages in the sense that each physical macro is assigned certain wiring resources by the contract, while the rest of the wiring resources are blocked. Any resources that are blocked for the macro designer are available to the unit designer and vice versa. As an example of such a contract, the logic designer may be assigned the lowest three metal layers and 10% of the fourth layer within the chip for (internal) macro routing; in that case, the unit integrator can claim the remaining 90% of the fourth layer as well as the higher levels for unit routing.

All the information to be shared between macro designer and unit integrator with respect to the macro cells is contained in so-called macro abstracts. By definition, a macro abstract is an "abstracted" view of a layout of a certain function; a macro abstract contains all information that the unit integrator may need in order to be able to carry out the integration tasks. Very early on during the design process, the macro abstract will contain the estimated area and the ratio of the physical macro outline. The macro abstract will also define the positions of pins of the macro under consideration. These pins are electrical connecting points used to pass signals from one design hierarchy to the next within the chip. During the definition of macro functionality, the logic designer creates pin names which define the connections to/from the macro and other macros within the unit or to other units. Pins for input and output signals of the macro (I/O pins) are usually placed on the boundary of the macro abstract (in which case they are called edge pins). Input or output pins may also be placed inside the macro abstract, in which case they are called bookpins and are usually located close to the circuit where the corresponding signal is generated. The physical pin placement is implemented by the unit integrator.

FIG. 1a shows a schematic representation of a logic designer's view of a unit 1 with three macros 2A, 2B and 2C to be placed onto a chip. Macros 2A and 2B comprise latches 3 as well as combinatorial logic 4, whereas macro 2C contains only combinatorial logic 4. Macros 2 comprise I/O pins denoted by numerals 7 in FIG. 1 as well as bookpins not shown in FIG. 1. Signal paths along wiring 5 inside the macros 2 are indicated by solid arrows. Dashed arrows 6 indicate links between macros 2 and from macros 2 to unit pins 8 required for attaining functional integrity of the design.

Figure 1B:
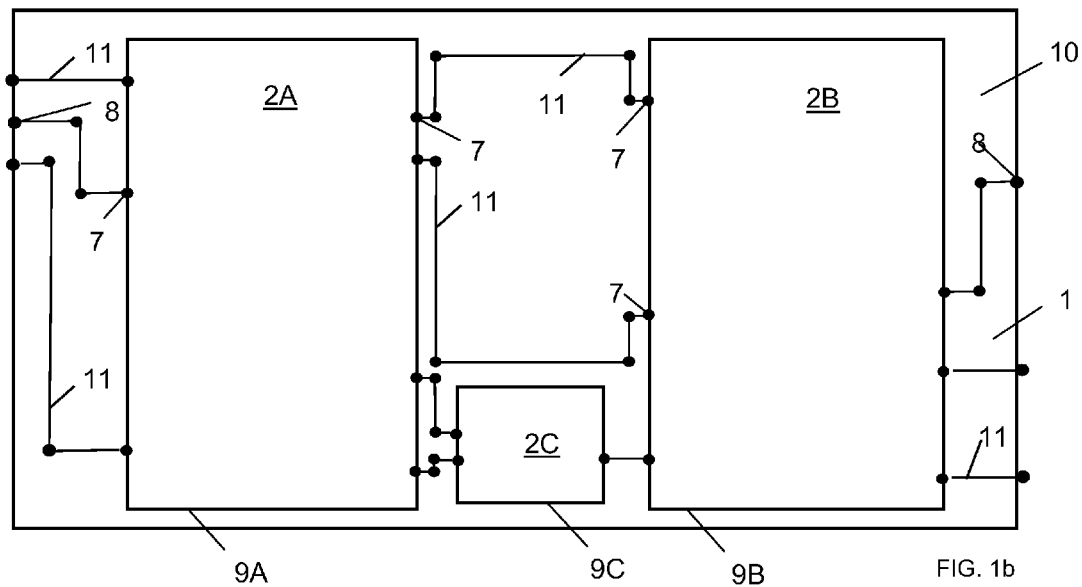
FIG. 1b the electronic design unit of FIG. 1a as seen by a unit integrator when using the state of the art placement method of FIG. 2.
Figure 1C:
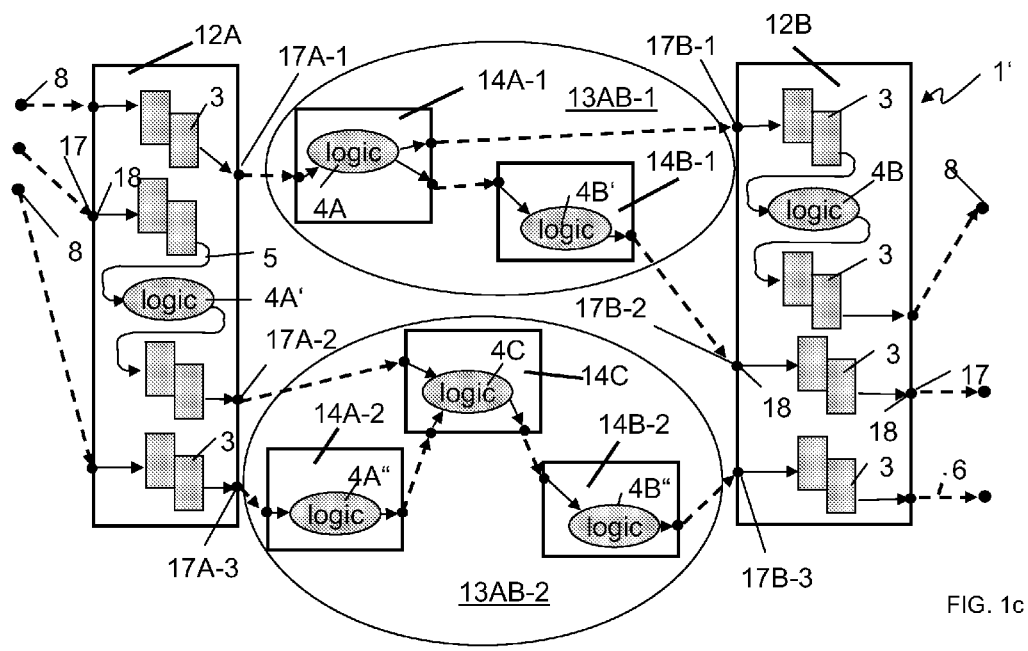
FIG. 1c the electronic design unit of FIG. 1a after repartitioning into latch macros and combinatorial macros.
Figure 1D:
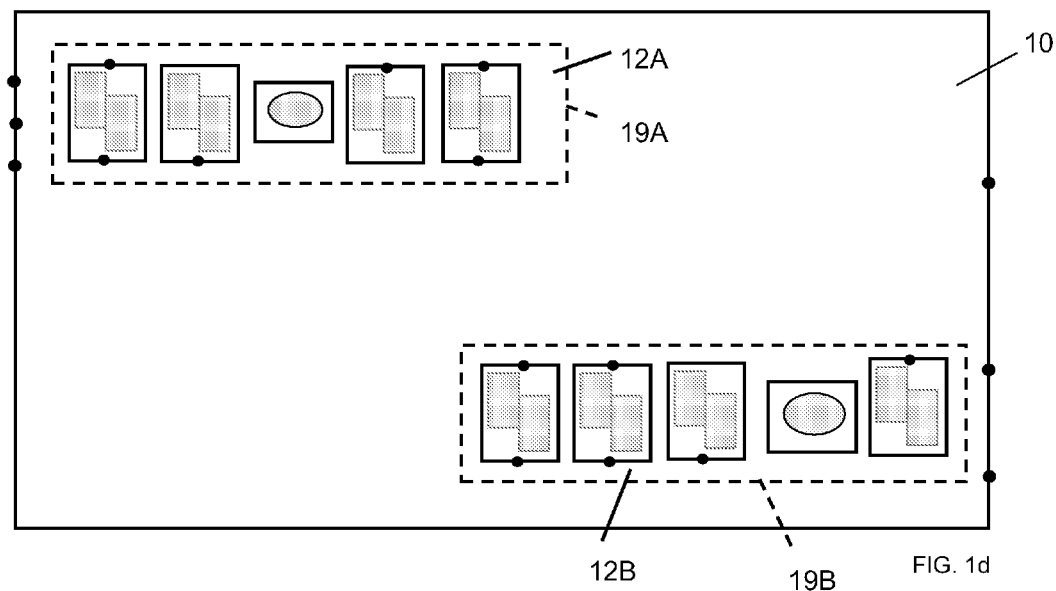
FIG. 1d an electronic design unit as seen by the unit integrator, after synthesizing and placing the latch macros.
Figure 1E:
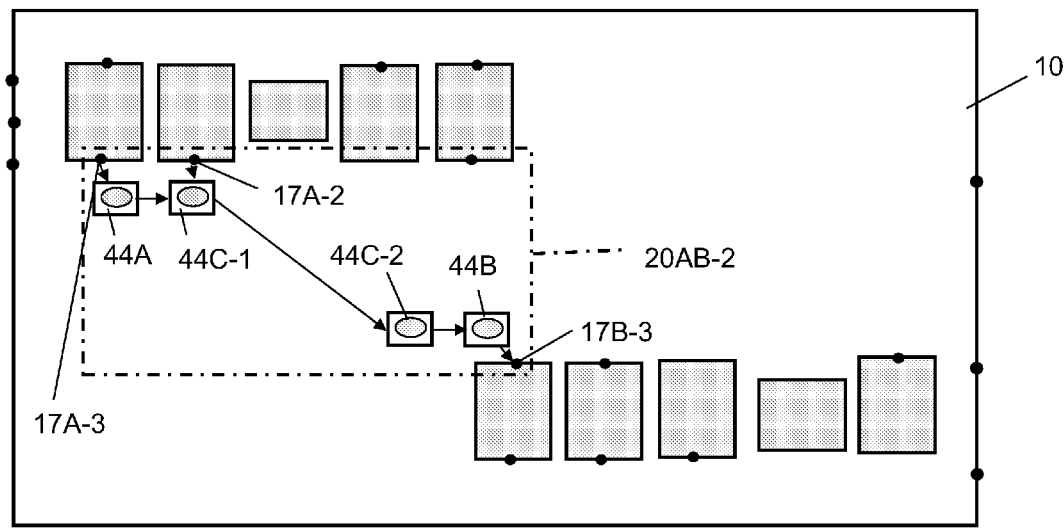
FIG. 1e the electronic design unit of FIG. 1d after placing and synthesizing the first combinatorial macro.
Figure 1F:
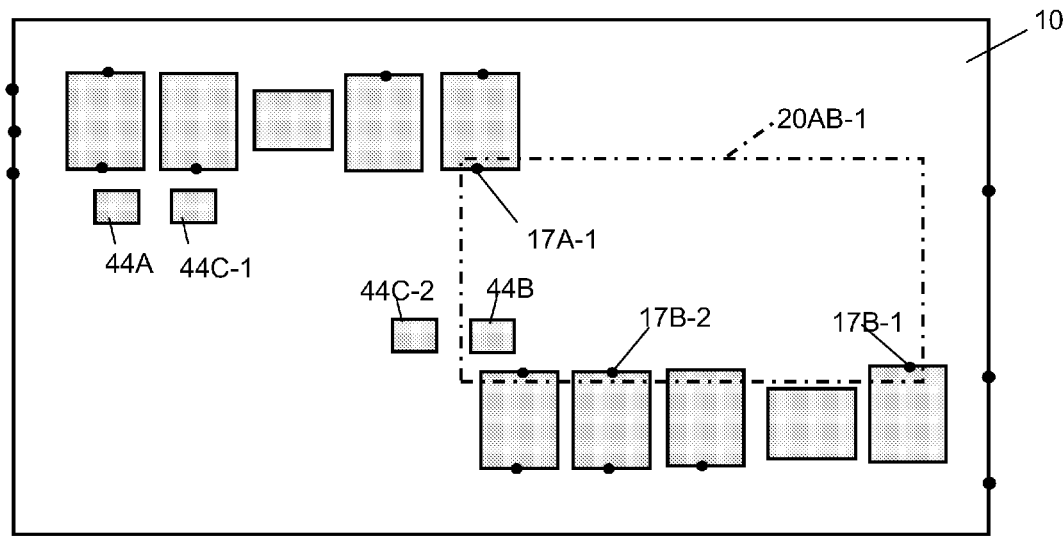
FIG. 1f the electronic design unit of FIG. 1e after defining the temporary boundary of the second combinatorial macro.
Figure 1G:
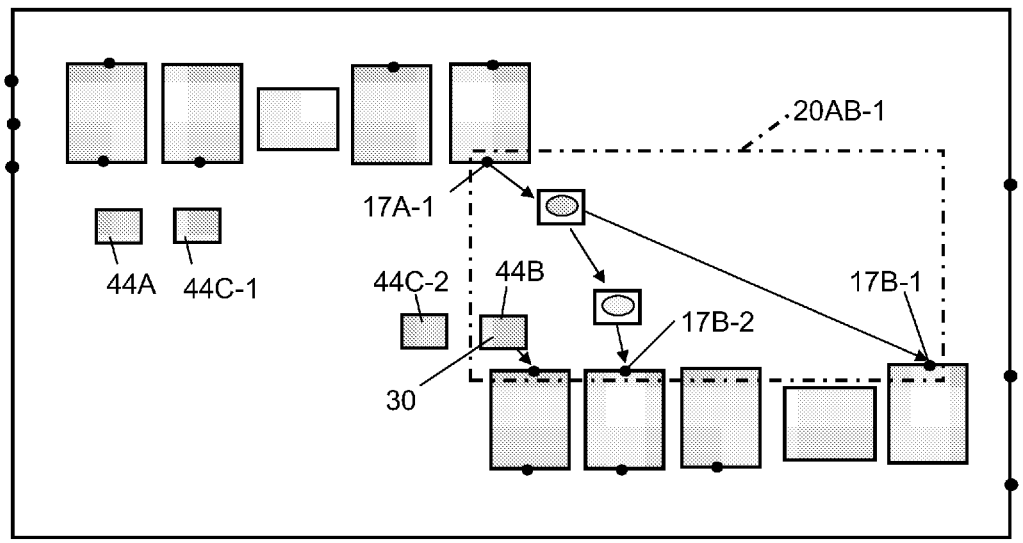
FIG. 1g the electronic design unit of FIG. 1f after placing and synthesizing the second combinatorial macro.
Figure 4:
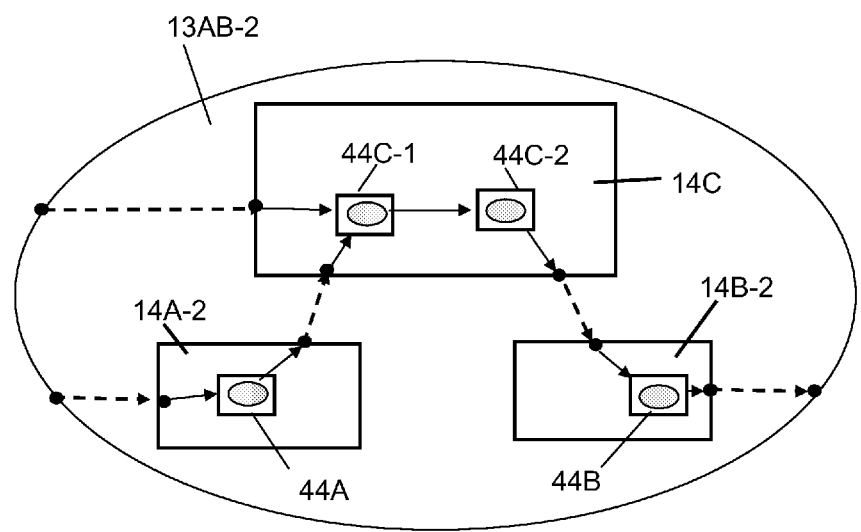
FIG. 4 detailed view of combinatorial macro 113AB-2 of FIG. 1c.
Figure 2:
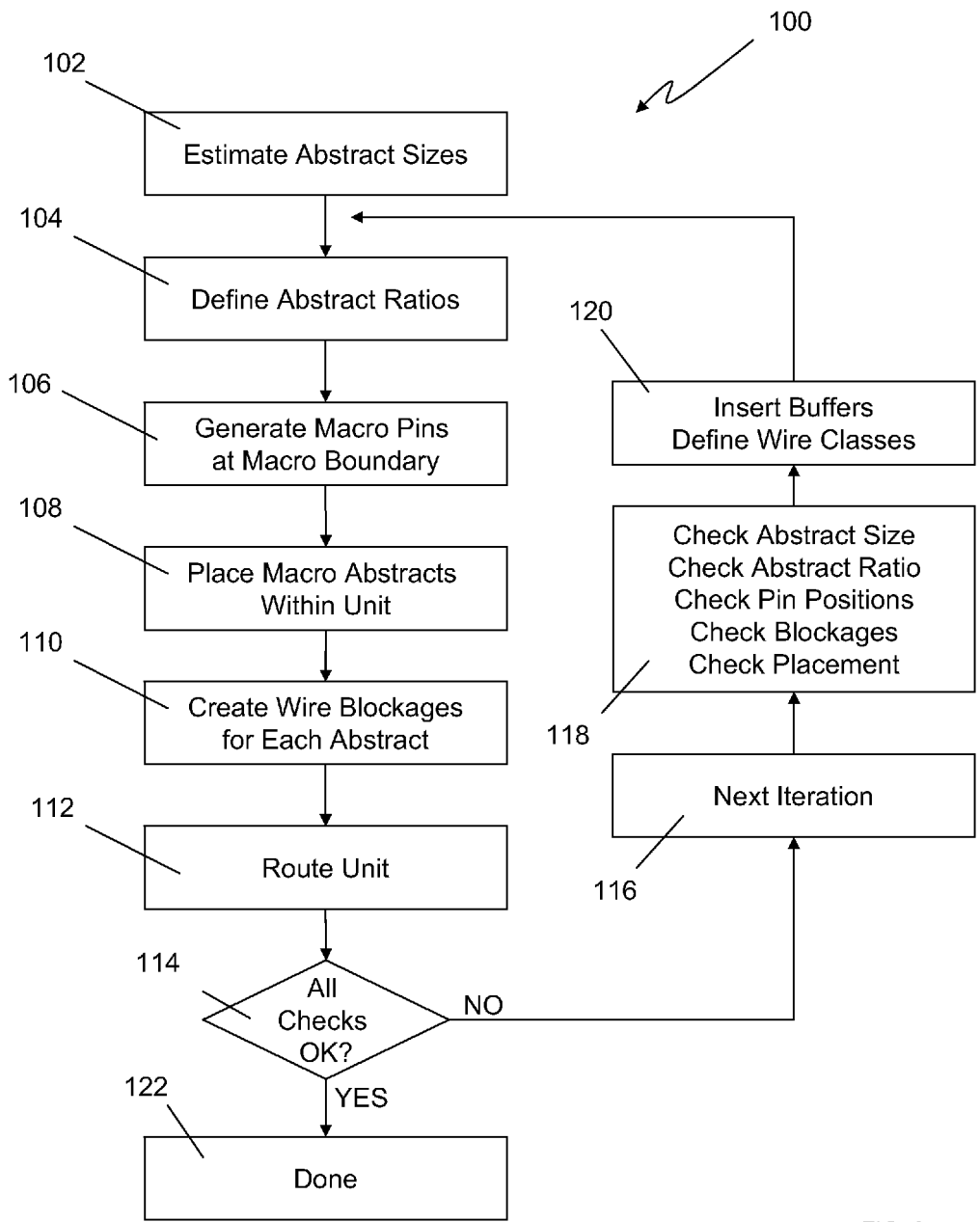
FIG. 2 a schematic method flow diagram of a prior art method of placing and routing macros within a unit on a chip.

FIG. 2 outlines a state-of-the-art method for placing and routing macros 2 within unit 1 on chip 10. In a first step (step 102), an abstract size, i.e. a physical area required for the macro, is estimated for each macro 2 to be placed onto chip 10. In FIG. 1, the abstract sizes of macros 2A, 2B and 2C correspond to the areas enclosed by boundaries 9A, 9B and 9C. Abstract size may be estimated from a best guess or may be generated by a first synthesized macro count. Subsequently, an abstract ratio is defined for each macro, i.e. the linear dimensions of a rectangular area reserved for accommodating the respective macro 2 are computed (step 104). Also, the positions of the macro I/O pins 7 on the boundaries 9 of these rectangular areas are defined (step 106). After all macro abstracts (i.e. sizes and shapes of rectangles reserved for the macros 2 as well as positions of macro I/O pins 7) have been generated by a logic designer in steps 102-106, these macro abstracts are placed within the unit 1 of chip 10 in placement step 108 by the unit integrator, i.e. the person responsible for placing, wiring buffering the electronic components on the chip. FIG. 1b shows the unit integrator's view of the design of FIG. 1a. Note that the unit integrator typically handles macros 2 as "black boxes" defined by the macro abstracts, in particular by macro boundaries 9 as well as I/O pin positions. In this context, the unit itself can be considered as a large macro, comprising macro abstracts, macro pins and unit pins.

For each macro abstract, wire blockages are created in step 110; for example, some wiring levels will be blocked within boundaries 9A-9C, since the areas are occupied by macros 2A-2C. Based on these wire blockages, unit 1 is routed in step 112; this routing relies solely on the macro abstracts, not on any specifics of the macros 2 themselves. The result of routing is indicated by wiring 11 in FIG. 1b.

Subsequently, the design thus routed is verified in step 114. If the verification is successful, the design thus generated is assessed to be valid (step 122). If, however, the verification fails, the macro abstracts (rectangle sizes and shapes as well as pin positions), macro placement and blockages will be checked (steps 116 and 118), buffers may be inserted and wire classes may be redefined in step 120. In a reiteration of steps 104 to 112, modifications are made to the macro abstracts, the size, ratio, pin position, blockage etc. of the modified macros is contracted iteratively between unit integrator and logic designer, the modified macros are placed and routed, and another verification step 114 is performed. This loop is reiterated until design verification (step 120) is successful. In general, this is a lengthy process using up a lot of time and resources.

In order to make the placement and wiring process more efficient, a method 200 is suggested makes use of the concept of temporary boundaries for placement and synthesis of the design components. As opposed to the state of the art method of FIG. 2 in which macro boundaries only vary if the macro requires more space, a temporary boundary according to the invention defines an area which is used only for a single process step.

Figure 3A:
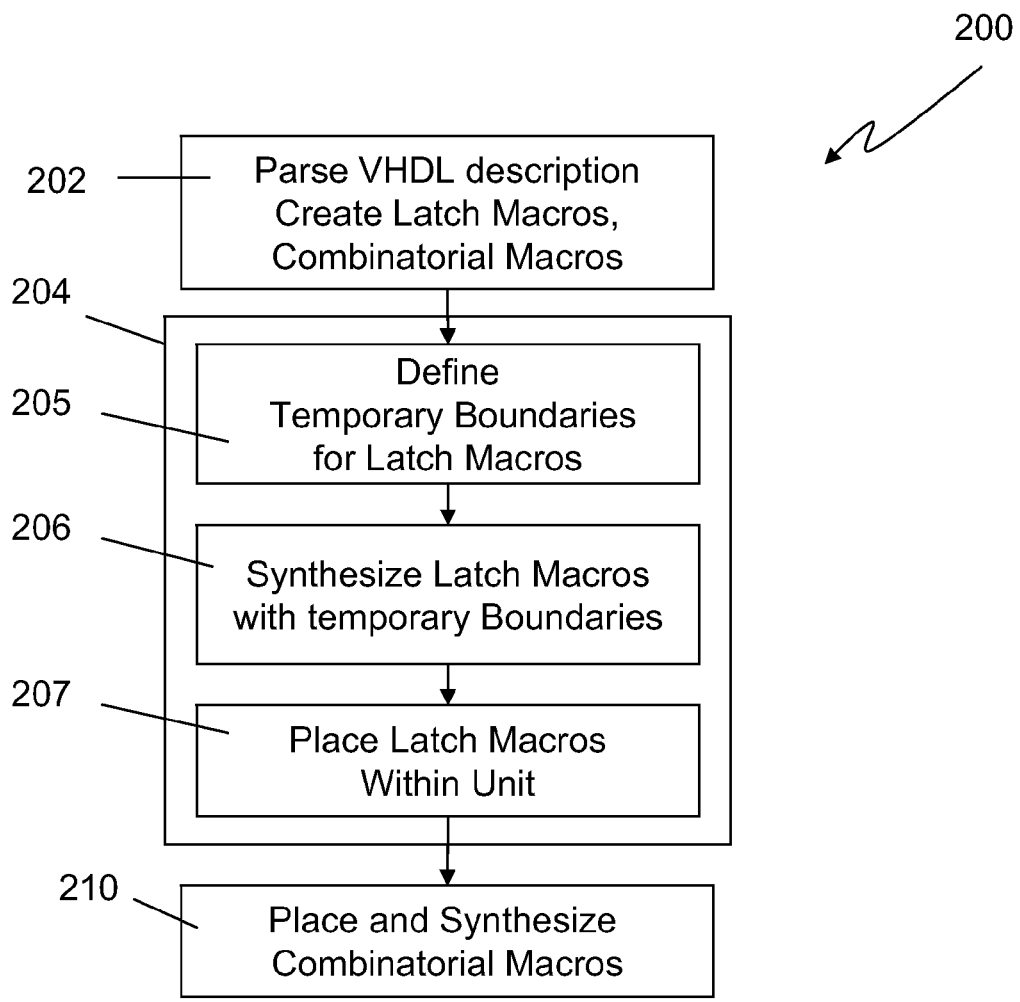
FIG. 3a a schematic method flow diagram of a preferred embodiment of a macro placing and routing method according to the invention.

FIG. 3a shows a schematic flow diagram of a preferred embodiment of a method 200 for placing and wiring macros 2 within unit 1 on a chip 10. Method 200 sets out from a hierarchical VHDL description of unit 1 and its macros 2; more generally, method 200 could set out from any hierarchical representation of the unit 1 in terms of a formalized hardware description language, e.g. a Verilog description or an RTL description.

As a first step 202, VHDL representation of unit 1 comprising macros 2 is repartitioned in terms of latch macros 12 and combinatorial macros 13. By definition, a combinatorial macro 13 contains no latches 3, but only combinatorial logic 4. A latch macro 12 contains one or several latches 3 and is constructed in such a way that each primary input/output PI/PO of the latch macro 12 coincides with an input or an output LI/LO of a latch 3 within this latch macro 12. A method of repartitioning unit 1 into latch macros 12 and combinatorial macros 13 is described in detail in co-pending patent application Ser. No. 12/831303 filed Jul. 7, 2010, "Method and System for Repartitioning a Hierarchical Circuit Design" the contents of which are incorporated by reference into this description. In a preferred embodiment, repartitioning step 202 comprises the steps of identifying all macros 2 containing latches 3, stripping each of these macros 2 of all combinatorial logic 4 and wiring 5 located between the latches 3 and the I/O pins of said macro 2, thus generating latch macros 12, and based on unit connectivity, regrouping the stripped-off combinatorial logic 4 and wiring 5', potentially including additional combinatorial logic, into combinatorial macros 13.

An example of this repartitioning step 202 as applied to the design unit 1 of FIG. 1a is shown in FIG. 1c: The VHDL descriptions of the original macros 2A, 2B are stripped of all combinatorial logic 4A, 4A", 4B', 4B". The original primary inputs/outputs 7 connected to the removed combinatorial logic 4A, 4A", 4B', 4B" remain with their source/target gates. New primary inputs/outputs are generated to define the linking of the latch macro with its formerly attached combinatorial logic partitions 4A, 4A", 4B', 4B". In this way, latch macros 12A, 12B are generated, each of which contains four latches 3 as well as combinatorial logic 4A', 4B interleaved between the proprietary latches 3 of each macro, respectively. All I/O pins 17 of the latch macros 12A, 12B are seen to coincide with outputs/inputs of latches 3 within these latch macros 12A, 12B. The chunks of combinatorial logic 4A, 4A", 4B', 4B" which were stripped off the original macros 2A, 2B, so-called signal cones 14, are indicated by boxes 14A-1, 14A-2, 14B-1 and 14B-2 in FIG. 1c. These signal cones 14—together with additional chunks of combinatorial logic such as logic 4C that may be located on signal paths between macros—are merged along unit signal paths, thus yielding combinatorial macros 13. In the example of FIG. 1c, signal cone 14A-1 originating from macro 2A is merged with signal cone 14B-1 originating from macros 2B to yield a combinatorial macro 13AB-1, the notation indicating that this combinatorial macro 13 is located between latch macros 12A and 12B. Also, signal cones 14A-2 and 14B-2 are merged with combinatorial logic 4C of original macro 2C to form combinatorial macro 13AB-2. Thus, original unit 1 macro structure is repartitioned into a new unit 1' macro structure containing latch macros 12A, 12B and combinatorial macros 13AB-1 and 13AB-2, and a new VHDL description of the new latch macros 12 and combinatorial macros 13 is generated.

Note that the combinatorial logic 4 (and thus the signal cones 14) will generally comprise several logic gates 44 (such as inverters, nands and nors), these logic gates 44 representing the lowest hierarchical level within the macro VHDL representation. As an example, combinatorial logic 4C may contain two logic gates 44C-1, 44C-2, whereas signal cones 14A-2 and 14B-2 contain one logic gate 44A, 44B each (see FIG. 1*d*). Thus, depending on the hierarchical level, combinatorial macro 13AB-2 may be considered as consisting of three interconnected signal cones 14A-2, 14B-2 and 14C or else consisting of four interconnected logic gates 44A, 44B, 44C-1 and 44C-2.

Following this repartition of the macro VHDL structure (step 202), latch macros 12 are synthesized and placed in step 204. As part of step 204, a temporary boundary 19 is assigned to each latch macro 12 in step 205. The size and ratio of the temporary boundaries 19 may be estimated, for example, by best guess and based on the number of latches contained in the latch macro and/or based on latch and circuit size. Note that only bookpins are taken into consideration as source and target of connections. Each latch macro 12 is synthesized within its temporary boundary (step 206). Thus, the regions within the temporary boundary 20 mark an area which gives placement algorithms the freedom to place the circuitry of the combinatorial macros between source and target in its optimal places.

Subsequently, these latch macros 12 are placed within unit 1' on chip 10 in step 207. This placement of latch macros 12 is carried out by the unit integrator, based on experience; thus, the unit integrator has full control of the overall structure of the latch macros 12 on the chip 10. FIG. 1*d* shows a unit integrator's view of chip 10 after placement of latch macros 12A, 12B, the temporary boundaries 19A, 19B of which are indicated by hashed lines.

Figure 3B:
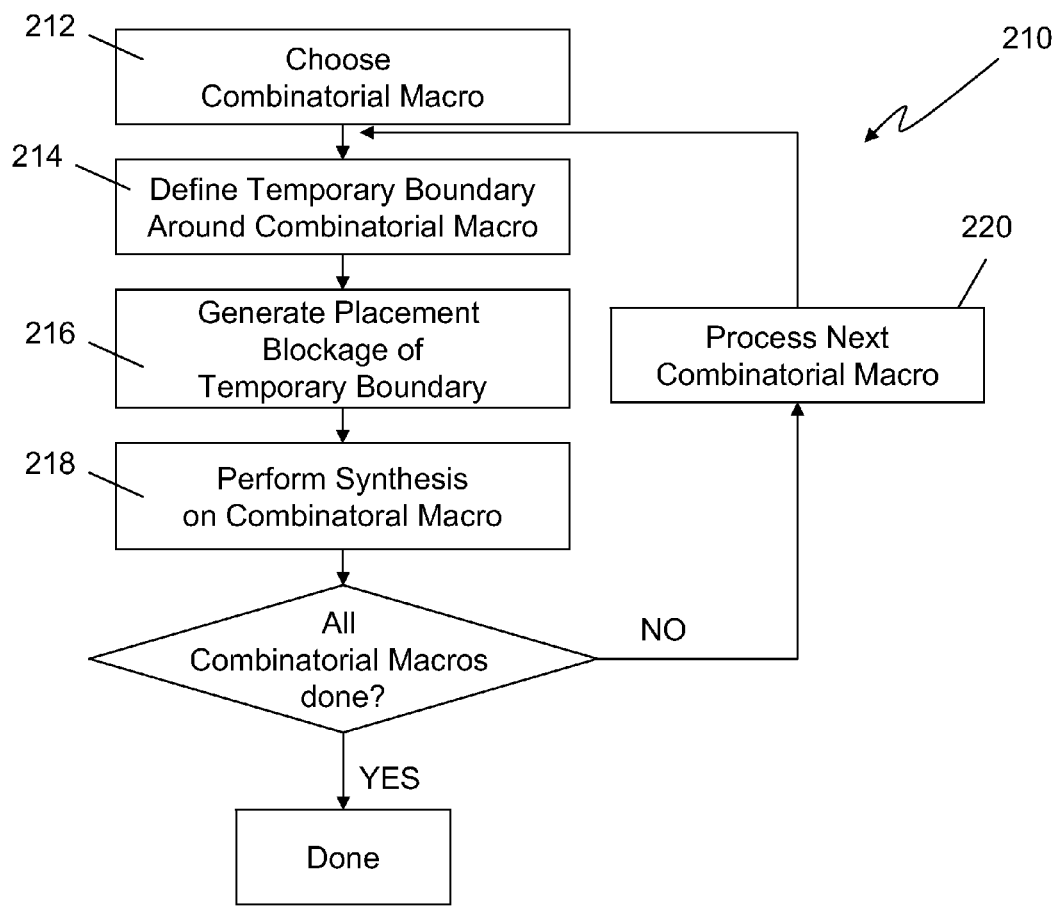
FIG. 3b a detailed flow diagram of step 210 of FIG. 3a, of placing and synthesizing combinatorial macros.

Once all latch macros 12 have been placed, combinatorial macros 13 are placed in combinatorial macro placement step 210, a preferred embodiment of which is shown in FIG. 3*b*. Step 210 contains a loop 220 which is iterated sequentially for all combinatorial macros 13 of the unit 1'. By iterating this loop 200, temporary boundaries 20 are sequentially defined for all combinatorial macros 13, one after the other. Each boundary 20 is dimensioned in such a way that it includes all primary pins (PIs and POs) of all latch macros 12 which the specific combinatorial macro 13 connects to. The temporary boundary 20 can thus be created automatically, since it results immediately from the combinatory logic. Assume that combinatorial macro 13AB-2 is processed first (step 212). A temporary boundary 20 is constructed around this combinatorial macro 13AB-2 in step 214. This is implemented by identifying all I/O pins 17 of latch macros 12 that are logically linked to combinatorial macro 13AB-2, and defining temporary boundary 20 in such a way that all these I/O pins 17 are contained within this boundary 20. As can be seen from FIG. 1*c*, inputs and outputs of combinatorial macro 13AB-2 are linked to pins 17A-2 and 17A-3 of latch macro 12A and to pin 17B-3 of latch macro 12B, and FIG. 1*e* shows the temporary boundary 20AB-2 for combinatorial macro 13AB-2 as a chain-dotted line. Note that temporary boundaries 19, 20 may overlap. The area within temporary boundary 20 is checked for blockages (step 216), and combinatorial macro 13 is synthesized inside the remaining free region within boundary 20 (step 218). In the example shown in FIG. 1*e*, no blockages exist within temporary boundary 20AB-2, so that the logic gates 44A, 44B, 44C-1 and 44C-2 of combinatorial macro 13AB-2 may be synthesized anywhere within boundary 20AB-2; the result of this synthesis will place logic gates 44A and 44C-1 adjacent to latch macro 12A and logic gates 44B and 44C-2 adjacent to latch macro 12B. After completing synthesis, steps 214-218 are reiterated for the next combinatorial macro 13 of the design, e.g. combinatorial macro 13AB-1. Again, connecting latch macro 12 I/O pins 17 are identified (in this case, 17A-1, 17B-1 and 17B-2), and temporary boundary 20AB-1 is defined in such a way that all these I/O pins 17 are contained within this boundary 20AB-1 (step 214), see FIG. 1*f*. Note that temporary boundaries 20 do not designate blockages, but only describe the general area available for combinatorial logic elements 4 or logic gates 44 during synthesis; therefore, temporary boundary 20AB-1 may overlap with temporary boundaries of other combinatorial macros (e.g. boundary 20AB-2 of combinatorial macro 13AB-2) which have already been placed. When generating placement blockage of this boundary 20AB-1 (step 216), it is found that the area occupied by logic gate 44B is blocked and thus is not available during synthesis of combinatorial macro 13AB-1. The area occupied by logic gate 44B thus constitutes a blockage 30 within boundary 20AB-1. Subject to this restraint, combinatorial macro 13AB-1 is synthesized, yielding the result shown in FIG. 1*g*.

Loop 220 is thus reiterated for all combinatorial macros 13 of the unit 1'. Note that step 210 actually translates the hierarchical structure of combinatorial macros 13 within unit 1' into a flat design of combinatorial logic elements 4 or logic gates 44.

Given the placement of latch macros 12 based on unit integrator's experience, combinatorial logic 4, 44 contained within combinatorial macros 13 can thus be placed automatically without manual interference of either logic designer or unit integrator. There is no more need of defining macro abstracts in terms of black boxes (as was the case in the state of the art method of FIG. 2). Note that in the course of steps 206 and 210 latch macros 12 and combinatorial macros 13 are dissolved into basic circuits (such as latches 3 and logic gates 44). Custom macros such as macro 4C can stay as custom macros. A subsequent routing procedure thus operates on a flat design. State of the art routers are powerful enough to be able to successfully handle the large number of atomic cells 44 of a flat design.

Figure 5:
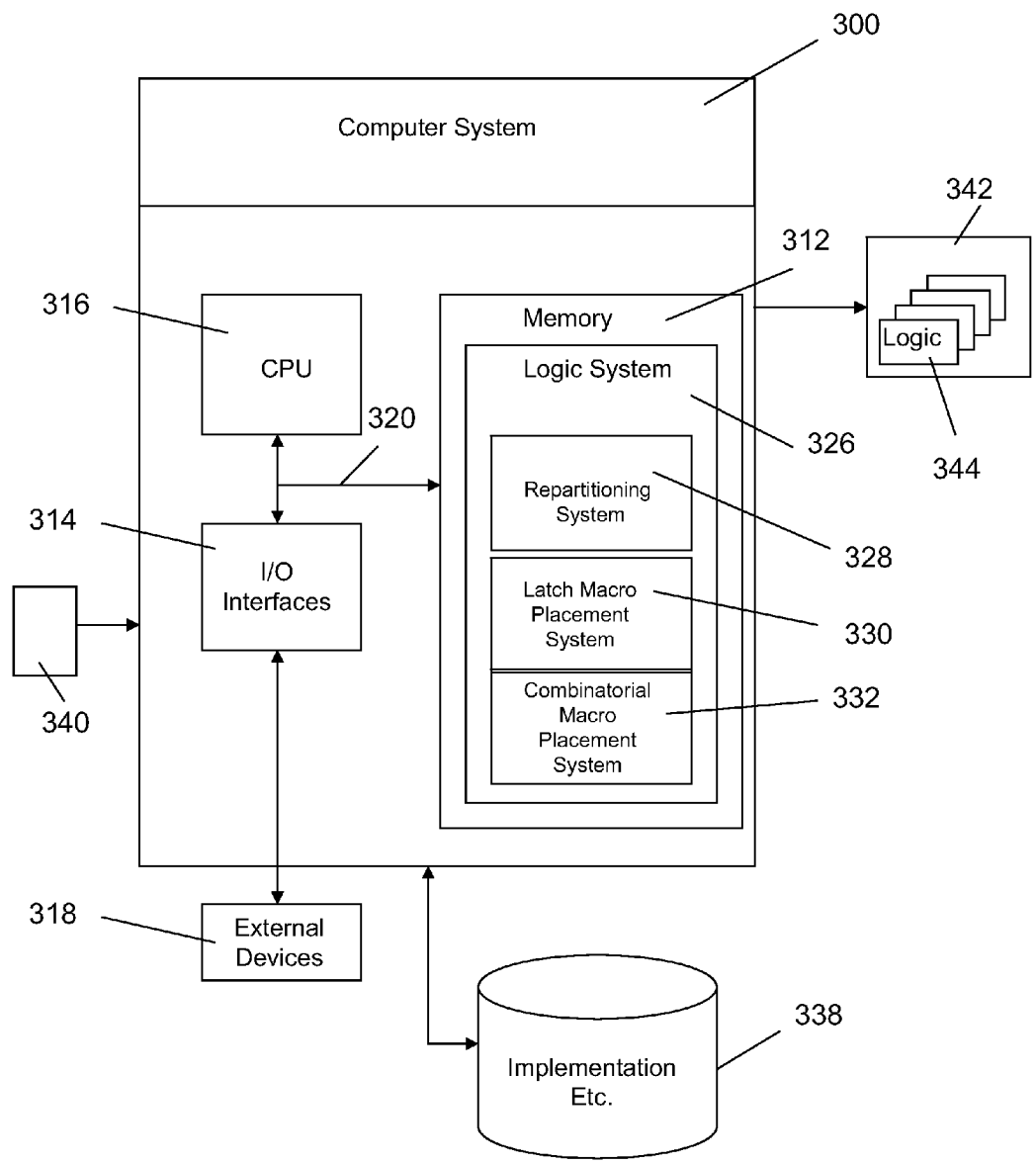
FIG. 5 a computer system implementation of the present invention.

Referring now to FIG. 5, a computer system 300 implementation of the preferred embodiment of the present invention is shown. Specifically, the present invention can be implemented as a computer system 300 and/or program product 326 for placing macros (2) of a multilevel hierarchical description of a design unit (1) on a chip (10). As depicted, computer system 300 generally comprises memory 312, input/output (I/O) interfaces 314, a central processing unit (CPU) 316, external devices/resources 318, bus 320 and data base 338. Memory 312 may comprise any known type of data storage and/or transmission media, including magnetic media, optical media, random access memory (RAM), read-only memory (ROM), a data cache, a data object etc. Moreover, memory 312 may reside at a single physical location, comprising one or more types of data storage, or can be distributed across a plurality of physical systems in various forms. CPU 316 may likewise comprise a single processing unit, or be distributed across one or more processing units in one or more locations, e.g. on a client and server.

I/O interfaces 314 may comprise any system for exchanging information from an external source. External devices 318 may comprise any known type of external device, including keyboard, mouse, voice recognition system, printer, monitor, facsimile etc. Bus 320 provides a communication link between each of the components in the computer system 300 and likewise may comprise any known type of transmission link, including electrical, optical, wireless etc. In addition, although not shown, additional components such as cache memory, communication systems, system software etc. may be incorporated into computer system 300.

Database 338 provides storage for information necessary to carry out the present invention. Database 338 may include one or more storage devices, such as a magnetic disk drive or an optical disk drive. In another embodiment, database 338 includes data distributed across, for example, a local area network (LAN), wide are network (WAN) or a storage area network (SAN) (not shown in FIG. 5). Database 338 may also be configured in such a way that one of ordinary skill in the art may interpret it to include one or more storage devices. Moreover, it should be understood that database 338 could alternatively exist within computer system 300.

Stored in memory 312 is logic system 326. As depicted, logic system 326 generally includes repartition system 328, latch macro placement system 330 and combinatorial macro placement system 332. The systems shown herein carry out the functions described above.

Repartitioning system 328 will repartition the macro structure of the design unit 1 into a set of latch macros 12 and a set of combinatorial macros 13. Based on this repartition, latch macro placement system 330 will synthesize and place latch macros 12. Subsequently, combinatorial macro placement system 332 will place and synthesize combinatorial macros 13.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer readable medium providing program code for use by or in connection with a computer or any instruction execution system. For the purposes of this description, a computer-usable or computer readable medium can be any apparatus that can contain, store, communicate, propagate, or transport the program for use by on in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read-only memory (CD-ROM), compact disk-read/write (CD-R/W) and DVD.

The invention claimed is:

1. A method for placing macros of a multilevel hierarchical description of a design unit on a chip, comprising the steps of
repartitioning the macro structure of the design unit into a set of latch macros and a set of combinatorial macros,
synthesizing and placing said latch macros, and
placing and synthesizing said combinatorial macros where, by definition,
a combinatorial macro is constructed in such a way that it contains no latches, and
a latch macro contains latches and is constructed in such a way that each primary input/output of the latch macro coincides with an input or an output of a latch within said latch macro.

2. The method according claim 1, characterized in that the synthesis of the latch macros is performed within temporary boundaries, said boundaries being temporary in the sense that they are only employed during latch macro synthesis.

3. The method according claim 1, characterized in that the synthesis of the combinatorial macros is performed within temporary boundaries, said boundaries being temporary in the sense that they are only employed during combinatorial macro synthesis.

4. The method according claim 1, characterized in that the synthesis and placement of the latch macros comprises the steps of
defining temporary boundaries for the latch macros, synthesizing the latch macros (12) within the temporary boundaries and
placing the latch macros thus synchronized within the design unit.

5. The method according claim 1, characterized in that the combinatorial macros are placed and synthesized sequentially, one after the other.

6. The method according claim 5, characterized in that the placement and synthesis of a combinatorial macro comprises the steps of
defining a temporary boundary for the combinatorial macro,
generating blockages within said temporary boundary, corresponding to areas unavailable for placement,
Synthesizing the combinatorial macro within said temporary boundary.

7. The method according claim 6, characterized in that the combinatorial macros are synthesized in terms of their constituent signal cones.

8. The method according claim 6, characterized in that the combinatorial macros are synthesized in terms of their constituent logic gates.

9. A system for placing macros of a multilevel hierarchical description of a design unit on a chip, comprising
a repartitioning system for repartitioning the macro structure of the design unit into a set of latch macros and a set of combinatorial macros;
a latch macro placement system for synthesizing and placing latch macros; and
a combinatorial macro placement system for placing and synthesizing combinatorial macros where, by definition,
a combinatorial macro is constructed in such a way that it contains no latches, and
a latch macro contains latches and is constructed in such a way that each primary input/output of the latch macro coincides with an input or an output of a latch within said latch macro.

10. A method according to claim 1 where the steps are performed on a data processing system using a data processing program.

11. The method according to claim 1 where the method uses a computer readable medium for causing a computer to perform the steps for placing macros.

* * * * *